(12) United States Patent
Qian et al.

(10) Patent No.: US 11,043,162 B2
(45) Date of Patent: Jun. 22, 2021

(54) OLED ON SILICON PRODUCT WITH SEPARATED CENTRAL CONTROL BOARD

(71) Applicant: SEEYA OPTRONICS CO., LTD., Shangjao (CN)

(72) Inventors: Dong Qian, Shanghai (CN); Tieer Gu, Shanghai (CN); Wenhui Zou, Shanghai (CN); Tong Wu, Shanghai (CN); Qi Li, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/627,506

(22) PCT Filed: May 11, 2018

(86) PCT No.: PCT/CN2018/086537
§ 371 (c)(1),
(2) Date: Dec. 30, 2019

(87) PCT Pub. No.: WO2019/119715
PCT Pub. Date: Jun. 27, 2019

(65) Prior Publication Data
US 2020/0160782 A1    May 21, 2020

(30) Foreign Application Priority Data

Dec. 19, 2017   (CN) .......................... 201711372791.0

(51) Int. Cl.
*G09G 3/30* (2006.01)
*G09G 3/3208* (2016.01)
(Continued)

(52) U.S. Cl.
CPC ............. *G09G 3/3208* (2013.01); *G09G 3/32* (2013.01); *H01L 27/3251* (2013.01);
(Continued)

(58) Field of Classification Search
CPC ................... G09G 3/32; G09G 3/3208; G09G 2300/0408; G09G 2310/027;
(Continued)

(56) References Cited

U.S. PATENT DOCUMENTS

2014/0132578 A1    5/2014  Zheng
2016/0013442 A1*   1/2016  Akimoto ............. H01L 27/3276
                                                        257/59
(Continued)

FOREIGN PATENT DOCUMENTS

CN          101295080 A         10/2008
CN          101609872 A         12/2009
(Continued)

*Primary Examiner* — Adam J Snyder
(74) *Attorney, Agent, or Firm* — Carlson, Gaskey & Olds

(57) ABSTRACT

A organic light-emitting diode (OLED) on Silicon product includes a circuit board, a central control board and an OLED on Silicon display panel located on the circuit board. A core control module and a timing control module are integrated in the central control board. The OLED on Silicon display panel has a display region, a gate row driving region, a source signal driving region, and a bonding region. OLED display pixels are provided in the display region. A gate row driving circuit is integrated in the gate row driving region. A source signal driving circuit is integrated in the source signal driving region. The bonding region is a region where the OLED on Silicon display panel is bound to the central control board. The OLED on Silicon product simplifies the processing process, reduces the cost and overall size of the product, and increases the area proportion of the display region.

12 Claims, 4 Drawing Sheets

(51) Int. Cl.
    *H01L 27/32*     (2006.01)
    *G09G 3/32*     (2016.01)
    *H01L 25/04*     (2014.01)

(52) U.S. Cl.
    CPC ............... *G09G 2300/0408* (2013.01); *G09G 2310/027* (2013.01); *G09G 2310/0286* (2013.01); *G09G 2310/0289* (2013.01); *G09G 2310/08* (2013.01); *H01L 25/048* (2013.01); *H01L 27/3225* (2013.01)

(58) Field of Classification Search
    CPC ... G09G 2310/0286; G09G 2310/0289; G09G 2310/08; H01L 25/048; H01L 27/3225; H01L 27/3251
    See application file for complete search history.

(56) References Cited

U.S. PATENT DOCUMENTS

| | | | |
|---|---|---|---|
| 2018/0061307 A1* | 3/2018 | Inoue | G09G 3/3275 |
| 2018/0061344 A1* | 3/2018 | Kurokawa | G09G 3/3233 |
| 2018/0102085 A1* | 4/2018 | Pan | G09G 3/3291 |
| 2018/0212011 A1* | 7/2018 | Lai | H01L 27/3276 |
| 2018/0336818 A1* | 11/2018 | Zheng | G09G 3/3225 |
| 2019/0122616 A1* | 4/2019 | Lee | G09G 3/3233 |
| 2019/0180696 A1* | 6/2019 | Park | G09G 3/3233 |

FOREIGN PATENT DOCUMENTS

| | | |
|---|---|---|
| CN | 102074193 A | 5/2011 |
| CN | 105185816 A | 12/2015 |
| WO | 2007/120475 A2 | 10/2007 |

\* cited by examiner

OLED ON SILICON PRODUCT WITH SEPARATED CENTRAL CONTROL BOARD

The present application claims priority to Chinese Patent Application No. 201711372791.0, filed on Dec. 19, 2017, with a title "OLED on Silicon product", the content of which is incorporated herein by reference in its entirety.

TECHNICAL FIELD

The present disclosure relates to the field of semiconductor manufacturing, and particularly to an OLED on Silicon product.

BACKGROUND

Distinguished from conventional AMOLED devices that use amorphous silicon, microcrystalline silicon, or low-temperature polysilicon thin film transistors as backplanes, OLED on Silicon products (such as OLED on Silicon micro display devices) use a monocrystalline silicon chip as a substrate, of which an OLED display pixel size is one tenth of that of the conventional display devices, and of which a fineness is much higher than the conventional devices.

Among them, an OLED on Silicon display panel (a monocrystalline silicon chip) can adopt the existing mature integrated circuit CMOS process, such that an active addressing matrix of the OLED display pixel and a multi-functional drive control circuit such as SRAM memory on the OLED on Silicon display panel can be achieved, thereby reducing external wiring of the device, increasing reliability, and achieving light weight.

SUMMARY

A problem addressed by the present disclosure is to provide an OLED on Silicon product for improving the OLED on Silicon products.

In order to solve the above problem, the present disclosure provides an OLED on Silicon product, including a circuit board, as well as a central control board and an OLED on Silicon display panel that are located on the circuit board. A core control module and a timing control module are integrated in the central control board. The OLED on Silicon display panel includes a display region, a gate row driving region, a source signal driving region, and a bonding region. OLED display pixels are provided in the display region. A gate row driving circuit is integrated in the gate row driving region. A source signal driving circuit is integrated in the source signal driving region. The bonding region is a region where the OLED on Silicon display panel is bound to the central control board.

Optionally, the gate row driving region is located on two sides of the OLED display pixels in the display region, the source signal driving region and the bonding region are located on a side of the display region, and the bonding region is located on an external side of the source signal driving region.

Optionally, the source signal driving circuit includes an interface module, a line buffer module, a level shifter module, a digital-to-analog converter module, and an analog buffer module that are connected in a sequence.

Optionally, the line buffer module includes a shift register module and a latch module, the latch module includes a sampling module and a memory module, and a device of the latch module is a low voltage device.

Optionally, the source signal driving circuit further includes a reference voltage module.

Optionally, a device of the digital-to-analog converter module is a medium voltage device.

Optionally, the digital-to-analog converter module is a ramp digital-to-analog converter or a resistive digital-to-analog converter.

Optionally, an interface in the interface module is an LVDS interface, an MIPI interface, or an eDP interface.

Optionally, the central control board further includes an interface module, an oscillator module, a one-time programming module, and a static random access memory module.

Optionally, the OLED on Silicon product is a micro display product.

Compared with the prior art, the technical solution of the present disclosure has the following advantages:

In the present disclosure, modules in the source signal driving circuit are integrated in the OLED on Silicon display panel, specifically integrated in the source signal driving region, and the central control board is disposed on a circuit board that can be a PCB or FPC outside the OLED on Silicon display panel by adhering or the like.

The advantages thereof are in that the modules requiring relatively simple processing process, such as modules that process analog signals, are separated from the modules requiring relatively complex processing process, such as modules that process digital circuits, such that they can be manufactured separately instead of all being manufactured with the complicated processing processes, thereby avoiding cost waste and reducing the cost. Moreover, with the design of the present disclosure, the integrated bonding region (i.e., the IC region) on the OLED on Silicon display panel is smaller, so that the OLED on Silicon product can be made smaller. Accordingly, the area proportion of the display region is increased, i.e., a screen occupation ratio is increased. At the same time, since the corresponding modules of the central control board are no longer integrated in the OLED on Silicon display panel, the layout tasks of the OLED on Silicon display panel are greatly reduced, and the development cycle is shortened.

DESCRIPTION OF EMBODIMENTS

In an existing OLED on Silicon, a chip (IC) is generally directly integrated in the OLED on Silicon display panel. However, compared with the OLED display pixels in the display region, modules in the chip have more types of device. The modules in the chip for processing digital signals have more complicated processing processes with higher requirements, and can only be manufactured in a higher generation production line, which results in a high process cost. Further, if all the modules are integrated on the display panel, a layout area of the non-light-emitting region will be greatly increased, so that the entire product becomes larger in size and cannot be made in a smaller size. Such many modules are integrated in the OLED on Silicon display panel that the product development cycle is significantly prolonged.

Figure 1:
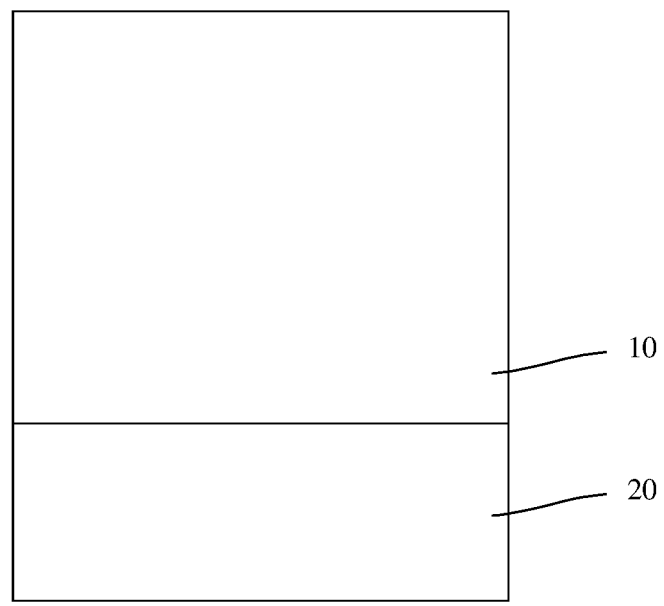
FIG. 1 is a schematic diagram of an existing OLED on Silicon product.

Specifically, one of the existing OLED on Silicon products is shown in FIG. 1. FIG. 1 illustrates an OLED on Silicon display panel (not labeled) in the product, which includes a display region 10 and a non-display region 20. In most cases, an integrated circuit (IC) is primarily integrated directly in the non-display region 20 of the OLED on Silicon display panel. In a broad sense, the IC mainly includes various driving circuit (driver) modules and a central control board (timer control register, TCON). The integrated circuit manufactured in the non-display region 20 includes a core control module (core-state controller), various driving circuits (Drivers), a timing control module, and an interface module (interface), etc. The integrated circuit have various types of modules and structures, such that it is manufactured with more complicated processing processes and in a higher generation production line than a display OLED display pixel array in the display region 10. When all the modules and structures in the integrated circuit are directly integrated in the non-display region 20 of the display panel, not only the complex process causes a high cost, but also the area occupied by the integrated circuit is large.

To sum up, in the OLED on Silicon product, if the corresponding integrated circuit is completely integrated in the OLED on Silicon display panel, the layout area of the non-light-emitting region of the OLED on Silicon display panel is increased, i.e., the area of the non-light-emitting region is large, such that the whole product has a larger size and cannot be made smaller. In addition, such many modules integrated in the OLED on Silicon display panel that the product development cycle is significantly prolonged. Further, since signals processed by different modules in the OLED display pixels and the integrated circuit in the display region have different signal properties (digital signals and analog signals), the corresponding device amplitudes and device sizes (classified into low voltage devices, medium voltage devices, and high voltage devices) are also different, and the processing processes differ from one another greatly. In order to ensure the product yield, the manufacturing should be performed according to the most demanding process, which increases the cost of the process, resulting in a considerably high cost of the entire product.

In view of the above, the present application provides an OLED on Silicon product to improve the configuration of the integrated circuit on the OLED on Silicon display panel, so as to simplify the corresponding process, reduce the cost, and reduce the overall size of the product, as well as to shorten the development cycle and further reduce the cost of the entire product.

In order to explain the above described objects, features, and advantages, embodiments of the present disclosure will be described in detail below in conjunction with the accompanying drawings.

Figure 2:
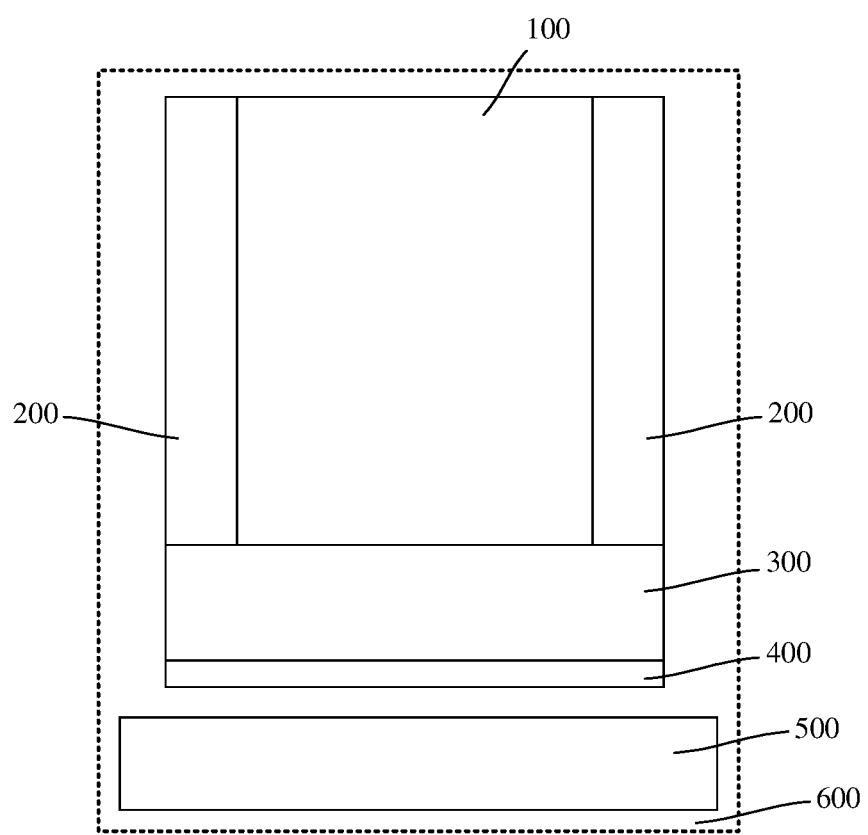
FIG. 2 is a schematic diagram of an OLED on Silicon product according to an embodiment of the present disclosure.

The embodiments of the present disclosure provide an OLED on Silicon product, as shown in FIG. 2.

The OLED on Silicon product includes a circuit board 600, and a central control board 500 and an OLED on Silicon display panel (not labeled) that are located on the circuit board 600. The central control board 500 and the OLED on Silicon display panel are located on the same surface of the circuit board 600, and are adjacent to each other with a certain gap or directly adjacent to each other.

The OLED on Silicon display panel includes a display region 100, a gate row driving region 200, a source signal driving region 300, and a bonding region 400.

OLED display pixels (not shown) are provided in the display region 100.

A gate row driving circuit (not shown) is integrated in the gate row driving region 200.

Figure 3:
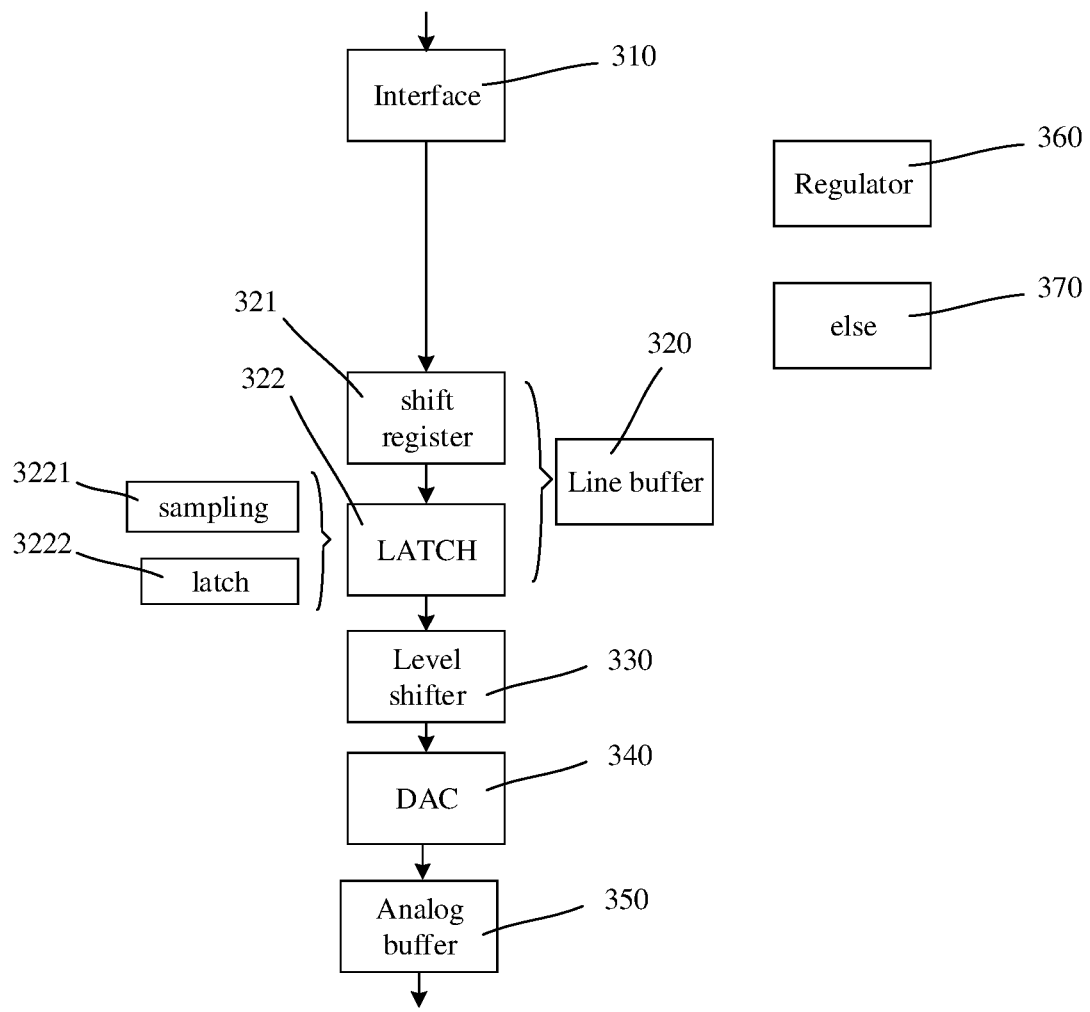
FIG. 3 is a structural schematic diagram of modules in a source signal driving region.

A source signal driving circuit is integrated in the source signal driving region 300 (refer to FIG. 3).

The bonding region 400 is a region where the OLED on Silicon display panel is bonded to the central control board 500.

In the OLED on Silicon product provided by the present embodiment, the OLED on Silicon display panel has the OLED display pixels arranged in rows and columns in the display region 100.

In other embodiments, the display region 100 may have OLED display pixels in other quantities and in other arrangements.

In the present embodiment, the gate row driving circuit integrated in the gate row driving region 200 is configured to provide a gate scanning signal to the display region 100.

In the present embodiment, it is further set that the display region 100 has a rectangular shape, and the gate row driving regions 200 are located at two corresponding side edge regions outside two ends of the rows of the OLED display pixels (left and right sides in FIG. 2), and the source signal driving region 300 and the bonding region 400 are located at a corresponding side edge region outside one end of the columns of the OLED display pixels (a lower side in FIG. 2). The gate row driving regions 200 are located outside two opposite sides of the rectangular shape of the display region 100, and the source signal driving region 300 and the bonding region 400 are located beyond another side of the rectangular shape of the display region 100. Moreover, in the present embodiment, the bonding region is located on an external side of the source signal driving region. That is, as shown in FIG. 2, the bonding region 400 is further located below the source signal driving region 300.

It should be noted that, in other implementations, the OLED on Silicon product may also be set in such manner that the gate row driving regions are disposed at two corresponding side edge regions outside two ends of the columns of the OLED display pixels, that is, the gate row driving circuits are located at the two corresponding side edge regions outside the two ends of the columns of the OLED display pixels. Correspondingly, the source signal driving region and the bonding region are located in a corresponding side edge region outside one end of the rows of the OLED display pixels.

The bonding region 400 may be a wire bonding region. In the present embodiment, all the required driving signals on the OLED on Silicon display panel can be obtained by bonding to the central control board 500, so as to be connected to the driving signals provided by the central control board 500. The specific bonding method can be a wire bonding.

The circuit board 600 may be a printed circuit board (PCB) or a flexible printed circuit board (FPC).

The OLED on Silicon display panel may be disposed on a surface of the circuit board 600 by pasting or the like.

The central control board 500 may also be fixed to the surface of the circuit board 600 by means of adhering or the like (or other suitable means).

In the present embodiment, the source signal driving circuit in the source signal driving region 300 is used to provide a data signal to the OLED display pixels in the display region 100.

As shown in FIG. 3, the source signal driving circuit in the source signal driving region 300 includes: an interface module 310 (interface), a line buffer module 320 (line buffer), a level shifter module 330 (level shifter), a digital-to-analog converter module 340 (digital to analog converter, DAC), and an analog buffer module 350 (analog buffer) that are connected in sequence.

As shown in FIG. 3, the line buffer module 320 includes a shift register module 321 (shift register, SR) and a latch module 322 (LATCH). The latch module 322 includes a sampling module 3221 (sampling) and a memory module 3222 (latch).

As shown in FIG. 3, the source signal driving circuit further includes a reference voltage module 360 (regulator) that provides a stable voltage to the entire system.

As shown in FIG. 3, the source signal driving circuit further includes other modules 370 (else), which refers to other conventional modules included in the source signal driving circuit, in order to ensure the normal operation of the source signal driving circuit or exert other functions.

A process of mutual cooperation among the circuit modules shown in FIG. 3 is as follows:

An external signal first passes through the interface module 310, as described above, the interface module 310 adopts the LVDS interface technology to process the digital signal, and a low voltage device is correspondingly used; then, the signal enters the line buffer module 320 of the source signal driving circuit, this module includes a shift register module 321 and a latch module 322, the sampling module 3221 and the memory module 3222 in the latch module 322 process digital signals, and a low voltage device is correspondingly used; subsequently, the signal passes through the level shifter module 330 and enters the digital-to-analog converter module 340, and the digital-to-analog converter module 340 correspondingly uses a medium voltage device; finally, the analog-to-digital converter module 340 outputs an analog signal, and the analog signal passes through the analog buffer module 350 to be output to the OLED display pixel circuit as a data signal for the OLED display pixels.

In the present embodiment, the interface in the interface module 310 is a low voltage differential signaling (LVDS) interface. The LVDS interface utilizes low voltage differential signal transmission. With this kind of interface, the signal can be transmitted through a differential printed circuit board (PCB) line or a balanced cable. Due to adoption of a low voltage and low-current drive method, the LVDS interface enables low noise and low power consumption.

In other embodiments, the interface in the interface module 310 can be a mobile industry processor interface (MIPI) or an embedded display port (eDP) interface. Among them, the signals of the MIPI interface are transmitted in pairs, mainly in order to reduce interference. The signals of the MIPI interface are wired in pairs, and the two wires are in reverse phases when observing waveforms, such that a large part of existing external interference will be offset.

In the present embodiment, for the above-mentioned reasons, the device of the latch module 322 is set to be a low voltage device.

In the OLED on Silicon product provided by the present embodiment, the device of the digital-to-analog converter module 340 is a medium voltage device. In the display region 100 of the present embodiment, the device of the OLED display pixel can be manufactured using a medium voltage device. In this case, the device of the digital-to-analog converter module 340 and the device in the OLED display pixel can be manufactured using production lines having the same process capability, thereby simplifying the process and saving the cost.

In the OLED on Silicon product provided by the present embodiment, the digital-to-analog converter module 340 can be a ramp digital-to-analog converter or a resistive digital-to-analog converter.

Figure 4:
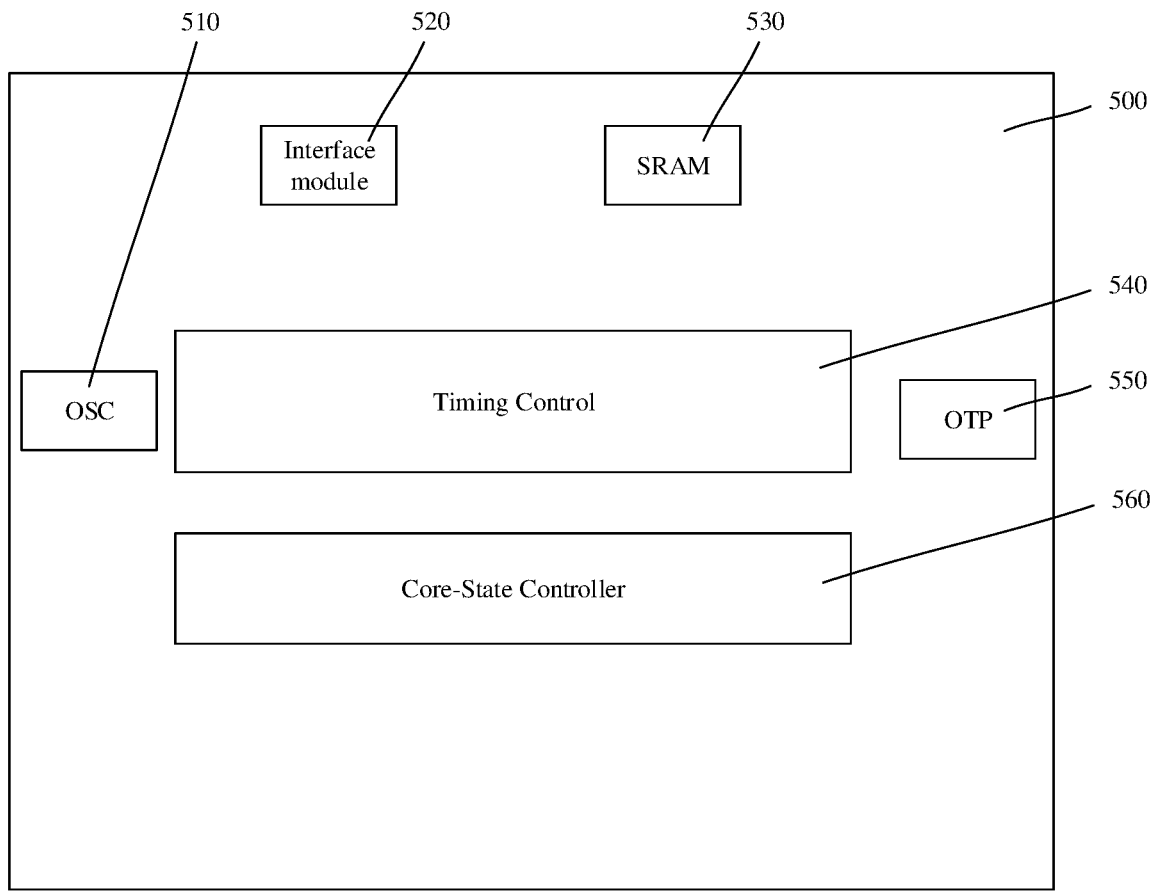
FIG. 4 is a structural schematic diagram of various modules in a central control board.

As shown in FIG. 4, a core control muddle 560 (core-state controller) and a timing control module 540 (timing control) are integrated in the central control board 500. The timing control module 540 is configured to provide a control signal to the source signal driving circuit.

The timing control module 540 and the core control module 560 both process digital signals, and both of them uses low voltage devices, which are also small-sized devices. However, they require more stringent processing processes. For example, modules such as the OLED display pixel array and the source signal driving circuit can be manufactured using a processing process with relatively low precision (fineness). However, modules such as the timing control module 540 and the core control module 560 can be manufactured only through a high-precision processing process. Higher process precision correspondingly requires higher process capability, and correspondingly requires higher fabricating cost. Moreover, the modules such as the timing control module 540 and the core control module 560 have complicated internal circuits, and thus occupy a particularly large area when they are manufactured on the OLED on Silicon display panel. Therefore, they are chosen to be manufactured separately in an external chip (i.e., in the central control board 500) instead of being integrated on the OLED on Silicon display panel.

As shown in FIG. 4, the central control board 500 further includes an oscillator module 510 (OSC), an interface module 520, a static random access memory module 530 (SRAM), and a one-time programming module 550 (OTP).

Regarding the low voltage devices and medium voltage devices mentioned in the present specification, it should be noted that, the low voltage devices generally refer to devices with operating voltages of 3.3V or less and having smaller size, which are more difficult to be manufactured; and the medium voltage devices refer to device operating under 3.3V to 8V.

The OLED on Silicon product (AMOLED on Silicon product) provided by the present embodiment is a micro display product, and specifically, the micro display product may be an AR product and a VR product, etc. Generally, the micro display product mainly refers to a panel display product smaller than 2 inches, and can be used as a wearable product such as an AR product and a VR product, which is not limited in the present disclosure. The technical solution of the present disclosure can be applied to any corresponding OLED on Silicon products in which the areas of the display region and the non-display regions are required to be adjusted, or in which the integrated circuit should be determined to be manufactured on the display panel or on an outer chip.

In the present embodiment, the different integrated modules and OLED display pixels in the display region 100 can be integrated in corresponding regions of the OLED on Silicon display panel. The reason is in that, in the processing process, they have the same or similar process flows and can be manufactured with production lines having the same process capability (saving steps and preventing different steps from adversely affecting other devices), without requiring the manufacturing process with higher process capability, thereby saving the cost.

In the present embodiment, the device modules, of which the processing processes are consistent with or similar to the processing process of the OLED display pixels, are integrated and manufactured together, achieving the effect of simplifying the process. Moreover, circuits such as the core control module requiring the complicated processes and high fineness are separately manufactured in the external chip. In this case, the OLED on Silicon display panel can be manufactured by a relatively simple processing process, which reduces the cost, reduces the bonding area required for the subsequent external chip, increases the occupation proportion of the display area, and reduces the size of the entire product.

In the OLED on Silicon product provided in the present embodiment, some device modules originally manufactured in the central control board 500 are directly integrated into the source signal driving region 300, i.e., integrated in the OLED on Silicon display panel. These device modules are device modules that use relatively simple processing processes, specifically including some modules in the gate row driving circuit and the source signal driving circuit, thereby simplifying the processing process, reducing the cost, reducing the overall size of the product, increasing the occupation proportion of the display area, as well as reducing the circuit structure and overall size inside the external central control board 500.

In the OLED on Silicon product provided in the present embodiment, a specific source signal driving circuit is integrated into the integrated circuit region of the OLED on Silicon display panel, and such redesigned source signal driving circuit can be simply manufactured by a production line with the common process capability, instead of requiring high-precision and high-capability production lines, thereby reducing the cost.

In the present embodiment, the modules requiring relatively simple processing process and the modules requiring relatively complicated process requirements are manufactured separately, which avoids the case where all of them are manufactured by the complicated process, thereby avoiding waste and reducing the cost.

In the OLED on Silicon product provided by the present embodiment, the area of the bonding region 400 (i.e., the IC bonding region, or the central control board bonding region) integrated on the OLED on Silicon display panel is smaller, so that the product can be made smaller, the oscillator module 510 (OSC), the interface module 520, the static random access memory module 530 (SRAM), the one-time programming module 550 (OTP), the timing control module 540, and the core control module 560 are no longer integrated on the OLED on Silicon display panel, thereby reducing the layout tasks in the non-light-emitting region and shortening the development cycle.

In the present embodiment, the modules with high precision requirements of the processing process and small size required for the process (which needs to be produced in the production line of high process capability) is separated from the module of the ordinary process (the production line of the general process capability), and the overall panel is simplified. The process is reduced, the cost is reduced; the development cycle is shortened, and the cost is further reduced.

To sum up, the existing OLED on Silicon products (the AMOLED on Silicon wearable products) usually integrate the entire chip (IC) in the OLED on Silicon display panel, which results in a larger area occupied by the non-light-emitting region of the OLED on Silicon display panel. Moreover, the signals processed by different modules in the OLED display pixels and the chip have different properties (digital signal and analog signal), the associated device amplitudes and device sizes are different, and the processing processes are also significantly different. In order to ensure the product yield, the products are required to be manufactured through the most demanding processing process, which significantly increases the process cost.

In contrast, in the new OLED on Silicon product provided by the present embodiment, the modules that process digital signals and require the complicated processing process, such as the oscillator module 510, the interface module 520, the static random access memory module 530, the one-time programming module 550, the timing control module 540, and the core control module 560, are no longer integrated on the OLED on Silicon display panel, which not only simplifies the processing process and greatly reduces the processing cost, but also reduces the overall size of the product. In the meantime, the development cycle is shortened and the cost of the entire product is further reduced.

In the new OLED on Silicon product provided by the present embodiment, the advantages of this configuration are described below. The module requiring high precision of the process and small size, i.e., the corresponding modules of the central control board for processing digital signals (TCON, which is required to be manufactured by a production line with high process capability), is separated from the modules manufactured with ordinary processes (i.e., the OLED display pixels, the gate row driving circuit and the source signal driving circuit in the above-mentioned OLED on Silicon display panel for processing analog signals, and these three are manufactured by the production lines with common process capabilities), such that the difficulty of the processing processes of the whole panel and the cost can be significantly reduced. By modifying the internal composition of the source signal driving circuit and the internal composition of the central control board 500, the corresponding integration manner is more rational, the area of the non-light emitting region in the panel is reduced, and the size of the entire panel is reduced, the development cycle of the OLED on Silicon display panel is shortened, and the product cost is further reduced.

The present disclosure is not limited to the above description. Various changes and modifications can be made by those skilled in the art without departing from the spirit and scope of the present disclosure, and the scope of the present disclosure shall be defined by the pending claims.

What is claimed is:

1. An OLED on Silicon product, comprising:
   a circuit board; and
   a central control board and an OLED on Silicon display panel that are located on a same surface of the circuit board,
   wherein a core control module and a timing control module are integrated in the central control board,
   the OLED on Silicon display panel has a display region, a gate row driving region, a source signal driving region, and a bonding region,
   OLED display pixels are provided in the display region,
   a gate row driving circuit is integrated in the gate row driving region,
   a source signal driving circuit is integrated in the source signal driving region,
   the bonding region is a region where the OLED on Silicon display panel is bound to the central control board, and
   the bonding region is located on an external side of the source signal driving region close to the central control board.

2. The OLED on Silicon product according to claim 1, wherein the gate row driving region is located on two sides of the OLED display pixels in the display region, and the source signal driving region is located on a side of the display region close to the central control board.

3. The OLED on Silicon product according to claim 1, wherein the source signal driving circuit comprises an interface module, a line buffer module, a level shifter module, a digital-to-analog converter module, and an analog buffer module that are connected in a sequence.

4. The OLED on Silicon product according to claim 3, wherein the line buffer module comprises a shift register module and a latch module, the latch module comprises a sampling module and a memory module, and a device of the latch module is a low voltage device.

5. The OLED on Silicon product according to claim 3, wherein the source signal driving circuit further comprises a reference voltage module.

6. The OLED on Silicon product according to claim 3, wherein a device of the digital-to-analog converter module is a medium voltage device.

7. The OLED on Silicon product according to claim 3, wherein the digital-to-analog converter module is a ramp digital-to-analog converter or a resistive digital-to-analog converter.

8. The OLED on Silicon product according to claim 3, wherein an interface in the interface module is an LVDS interface, an MIPI interface, or an eDP interface.

9. The OLED on Silicon product according to claim 1, wherein the central control board further comprises an interface module, an oscillator module, a one-time programming module, and a static random access memory module.

10. The OLED on Silicon product according to claim 1, wherein the OLED on Silicon product is a micro display product.

11. The OLED on Silicon product according to claim 1, wherein the central control board is fixed to the surface of the circuit board by means of adhering.

12. The OLED on Silicon product according to claim 1, wherein the bonding region is located between the source signal driving region and the central control board.

* * * * *